United States Patent [19]
Everard

[11] 4,243,977
[45] Jan. 6, 1981

[54] DELTA SIGMA TO PCM CONVERTER

[75] Inventor: John D. Everard, Ipswich, England

[73] Assignee: The Post Office, London, England

[21] Appl. No.: 873,972

[22] Filed: Jan. 31, 1978

[30] Foreign Application Priority Data

Feb. 7, 1977 [GB] United Kingdom ................ 5014/77

[51] Int. Cl.² ............................................. H04L 3/00
[52] U.S. Cl. ......................................... 340/347 DD
[58] Field of Search ................. 340/347 DD, 347 M; 325/38 B

[56] References Cited
U.S. PATENT DOCUMENTS

| | | | |
|---|---|---|---|
| 3,707,712 | 12/1972 | Deschenes | 340/347 DD |
| 3,716,849 | 2/1973 | Metcalf | 340/347 M |
| 3,825,831 | 7/1974 | Ishiguro | 325/38 B |
| 3,949,299 | 4/1976 | Song | 340/347 DD |
| 3,971,891 | 7/1976 | Wolcott | 340/347 DD |
| 4,002,981 | 1/1977 | Eggermont | 340/347 DD |
| 4,035,724 | 7/1977 | Stephenne | 340/347 DD |
| 4,087,754 | 5/1978 | Song | 340/347 DD |

Primary Examiner—Charles D. Miller
Attorney, Agent, or Firm—Cushman, Darby & Cushman

[57] ABSTRACT

A converter for converting a delta sigma modulated signal into a pulse code modulated signal comprises an n bit counter, an (n-1) true/complement, zero one element which is controlled by the most significant bit of the counter and operates on (n-1) bits of the counter in accordance with the pulse density modulation input to produce weighted output samples. An m bit accumulator accumulates the weighted samples to produce pulse code modulated samples.

18 Claims, 11 Drawing Figures

DELTA SIGMA TO PCM CONVERTER

This invention relates to a converter for converting a delta sigma modulated signal (also known as a pulse density modulated signal) into a pulse code modulated (PCM) signal.

A delta sigma modulated signal is a single bit magnitude code and consists of a stream of pulses, representing either binary 1 or 0, at a fixed frequency. The value of the output of the stream is the average ratio of "1"'s to "0"'s in the stream i.e. the average value of the stream.

A delta sigma modulator can be used as an initial stage in an analog to PCM encoder. The delta sigma modulator is fed with an analog signal to be digitized and produces a single bit per sample, delta sigma modulated code representative of the analog signal. The delta sigma modulated code has a relatively high sampling rate and is converted to a pulse code modulated signal having a considerably lower sample rate and comprising several bits per sample.

The present invention is concerned with a converter for converting a delta sigma modulated signal to PCM.

According to the present invention there is provided a converter for converting a delta sigma modulated signal to a pulse code modulated signal comprising an n bit counter, a true/complement, zero one element for operating on the bits of the counter in accordance with the pulse density modulation input to produce output samples, and an m bit accumulator for accumulating said samples to produce pulse code modulated samples.

The zero one element may be an $(n-1)$ bit true/complement zero one element which is arranged to operate on $(n-1)$ bits of the counter and is controlled by the most significant bit of the counter. The accumulator may comprise an m bit adder and an m bit latch.

The converter may include an output latch for receiving accumulated samples from the accumulator. The converter may include logic means between said m bit adder and said m bit latch.

In an alternative arrangement the element may be a p bit true/complement zero one element arranged to operate on p bits of the counter, said element having two control inputs one for receiving the pulse density modulated stream and the other being connected to a $2^p$ bit shift register which is arranged to be fed with the pulse density modulated stream.

The timing signals for the converter elements may be derived from the output of the counter.

The invention will be described now by way of example only with particular reference to the accompanying drawings.

In the drawings:

FIG. 1 is a block schematic diagram of a delta sigma modulation to PCM converter in accordance with the present invention;

FIGS. 2(a) to 2(c) illustrate the operation of the converter of FIG. 1;

Figure 5:
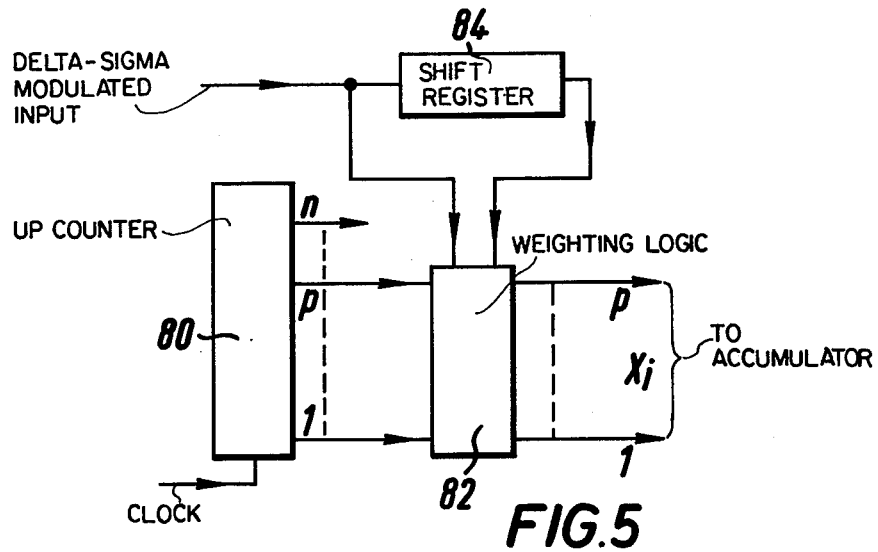
FIG. 5 is a block schematic diagram of an alternative form of converter.

FIGS. 6(a) to (c) and FIG. 7 illustrate the operation of the converter of FIG. 5.

The delta sigma modulation to PCM converter to be described has been designed for converting the output of a delta sigma modulator of the type described in Electronics Letters 22nd July 1976, Volume 12 No. 15, Pages 379 and 380. The converter in combination with such a delta sigma modulator is particularly suitable for telephony applications, e.g. for use in a codec in the digital switching device described in U.K. Patent Application No. 38689/76.

Figure 1:
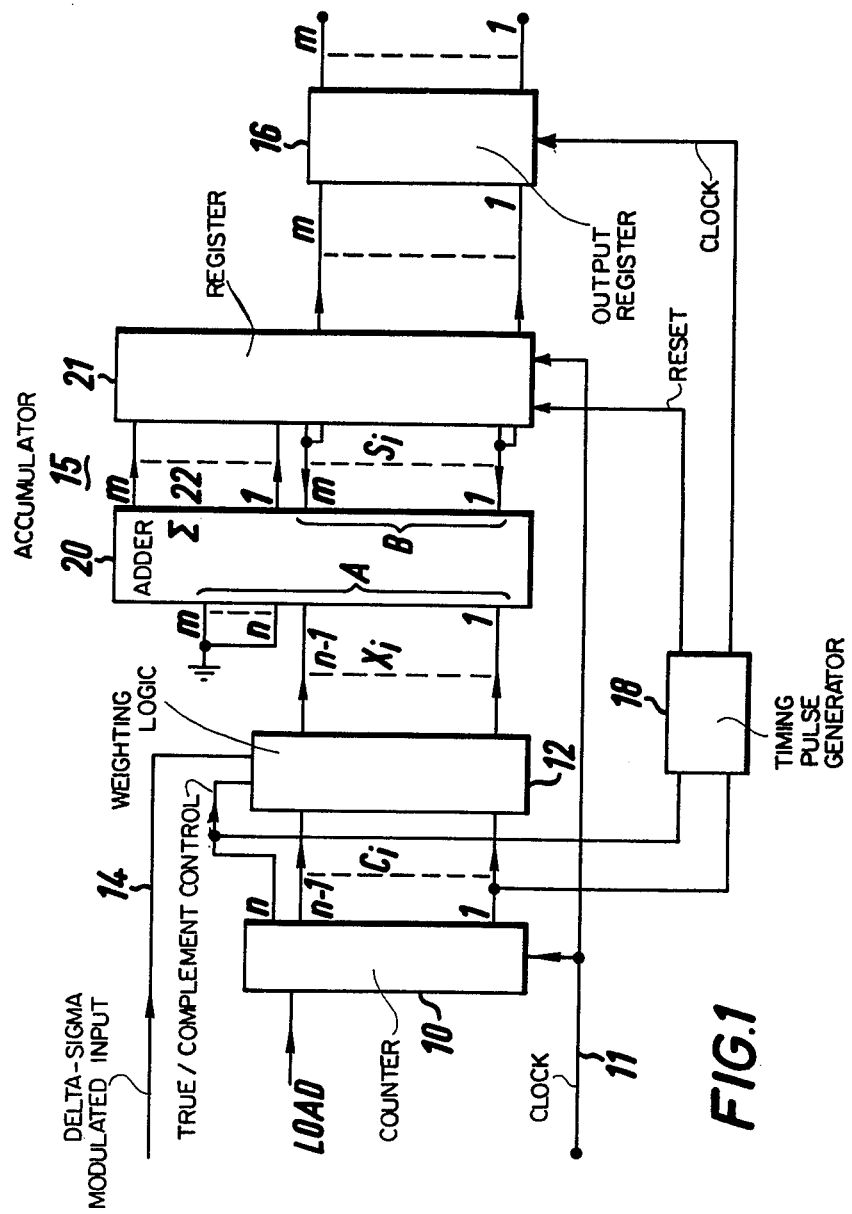

FIG. 1 shows schematically a first embodiment of a converter. It comprises an n bit counter 10 which receives clock signals on a line 11, logic means in the form of a 7 bit true/complement zero one element 12 for operating on $n-1$ bits of the counter, the logic means receiving the output of a delta-sigma modulator on a line 14, an m bit accumulator 15 and an output latch 16. The clock signals used to clock the counter 10 are the same as those used to drive the delta-sigma modulator. This ensures synchronous operation of the converter with respect to the input delta sigma modulator digit stream on the line 11. A timing pulse generator 18 is connected between the counter 10 and the output latch 16 and accumulator 15.

The m bit accumulator 15 consists of an m bit binary adder 20 and an m bit latch 21. The output of the latch 21 is connected to the B input of the adder 20. The "sum" output 22 of the adder 20 is connected to the input of the latch.

In operation the delta sigma modulated samples, typically 2048 K samples/sec, from the delta sigma modulator output are fed along line 14 to the element 12 in synchronism with the output of the counter 10 which is clocked at the same rate as the modulator. The counter 10 and the true/complement zero one element 12 effectively operate to multiply the incoming delta sigma samples by a weight sequence which has a triangular profile. This is achieved by arranging that the element 12 is controlled by the most significant bit of the counter 10. The counter 10 is arranged to successively count from 0 to its greatest value and when the most significant bit n of the counter changes from 0 to 1 the element 12 is changed from its true to complement condition. The effect of this is, although the counter 10 actually always counts upwardly, to make it appear as if the counter counts upwardly during the first half of a counting cycle and then downwardly during the second half, thereby achieving a triangular profile.

The weighted samples from the element 12 are accumulated in the accumulator 15 at the delta sigma modulator clock rate. Periodically at the end of each count period the contents of the accumulator 15 are clocked into the latch 16 under the control of clock signals from the generator 18 and the accumulator cleared for the next cycle. The sequence of numbers in the latch constitute the required linear PCM codewords in offset binary form. These can, for example, be applied to a linear to A-law converter prior to further processing. A-law compounded PCM is commonly used in telephony applications.

The operation of the converter of FIG. 1 will now be described in more detail with reference to FIG. 2. If the content of the latch 21 on the i th addition is $S_i$ and the number presented to the "A" input of the adder 20 is $X_i$ then, $$\epsilon_i = S_i + X_i$$

When the latch 21 is clocked, $\epsilon_i$ enters the latch and becomes $S_{i+1}$. Thus clocking the latch effectively accumulates all the numbers presented to the "A" input of the adder 20 since the last time the latch was cleared.

Figure 2A:
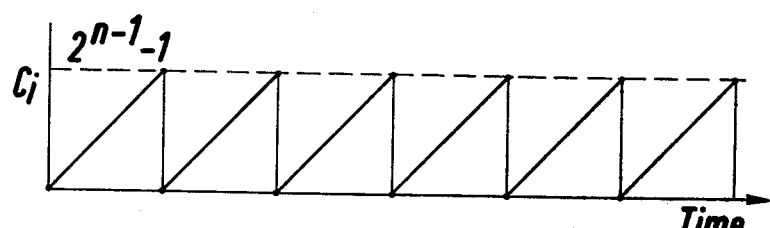
Figure 2B:
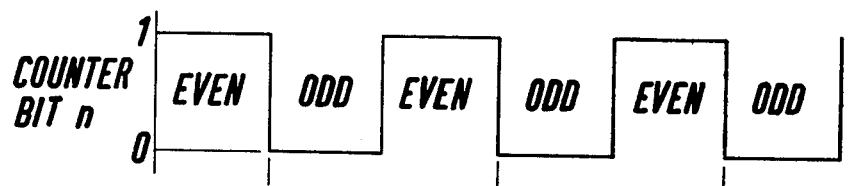

Referring to FIG. 2(a) the n bit counter 10 is clocked at the delta sigma modulator sample rate, the first (n−1) bits generating numbers zero to $2^{n-1}-1$. The nth bit of the counter 10 divides the generated number sawtooth into odd and even phases as shown in FIG. 2(b). Bit n is used in conjunction with output of the delta sigma modulator to cause the element 12 to operate on the count sequence to produce numbers to be added into the accumulator using the following algorithm (where $\Delta\Sigma$ is the output of the modulator):

If $\Delta\Sigma=0$ then $X_i=0$ whatever the counter state

If $\Delta\Sigma=1$ and counter bit n=0 (odd phases) then $X_i$ equals the count value $C_i$.

If $\Delta\Sigma=1$ and counter bit n=1 (even phases) then $X_i=\overline{C_i}$, the ones complement of the count value $C_i$.

Figure 2C:
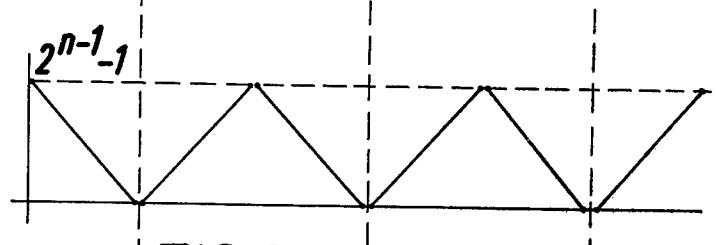

The number corresponding to $\overline{C_i}$ is equal to $[2^{n-1}-1]-C_i$. The effect of the operations is thus to provide a number sequence having a triangular profile as represented in FIG. 2(c), which on any clock cycle is added into the accumulator if $\Delta\Sigma=1$. Nothing is added in if $\Delta\Sigma=0$. Inverting the output of the delta-sigma modulator has the effect of inverting the output PCM samples.

At the end of each even period the contents of the accumulator are clocked into the latch 16 and the accumulator 15 is cleared to begin the next accumulation cycle. The sequence of numbers in the output latch 16 are linear PCM codewords in offset binary form.

If the sampling rate of the delta-sigma modulator is $f_1$ and the counter 10 is n bits long, linear PCM codewords are produced at the rate $f_2=f_1/2^n$. The maximum output would be produced if $\Delta\Sigma=1$ over the full accumulation period. There are $2^n$ additions and the average value of $X_i$ would be $(2^{n-1}-1)/2$. Thus the maximum accumulated number would be $$\frac{2^{n-1}-1}{2} 2^n = 2^{2(n-1)} - 2^{n-1}.$$

Thus the accumulator 15 must be $m=2(n-1)$ bits in length.

If, for example, $f_1=2048$ K samples/sec and $f_2$ is required to be 8 K samples/sec, then n=8 and the required accumulator length is $2(8-1)=14$ bits.

The timing pulses for clearing the accumulator 15 and clocking the output latch 16 are derived from the n bit counter states. In order to align the production of PCM samples with the timing requirements of the encoder system within which the converter is to work, the counter 10 is periodically loaded with the value that it ought to have at the instant of loading if it were producing samples at the correct time. Thus the first load pulse may bring the production of samples into time alignment but subsequent pulses will only attempt to load the counter with the value that the counter already possesses. They are necessary, however, to mitigate the effects of noise causing a circuit misoperation.

Figure 3:
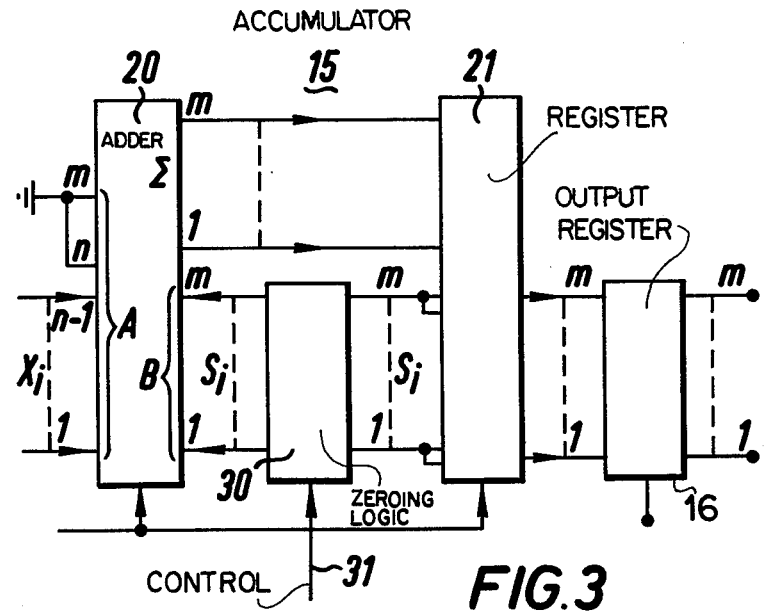
FIG. 3 is a block schematic diagram illustrating a modification of the converter of FIG. 1.

Referring to FIG. 3 there is shown a modification of the converter of FIG. 1 in which the accumulator 15 can be cleared whilst still allowing a full clock period for reading the accumulator content into the output latch 16 and also for the first addition of the next accumulation period. This is achieved by providing logic means 30 with a control line 31 between the output of the accumulator latch 21 and the B input of the adder 20. When the control line 31 is in the "accumulate" state the numbers from the latch 21 are passed into the "B" input of the adder 20 unaffected. At the end of each full accumulation period the state of the line 31 changes for one clock period. The logic means 30 present all zeros to the "B" input of the adder 20. As a result the number clocked into the latch 21 at the end of this clock period is zero plus whatever is presented to the A input, which is exactly the same as if the accumulator had been instantaneously cleared and the first number added in.

Additionally a further latch may be provided between the element 12 and the accumulator 15. This latch is clocked at the modulator rate to retime the numbers produced by the counter logic to the active edge of the clock pulse. This allows a full clock period to be used for the addition process which may be necessary when the speed of operation is near the limits of the technology employed. The pulses to the output latch 16 and to clear the accumulator 15 must be delayed by a further clock period if this is included.

Figure 4:
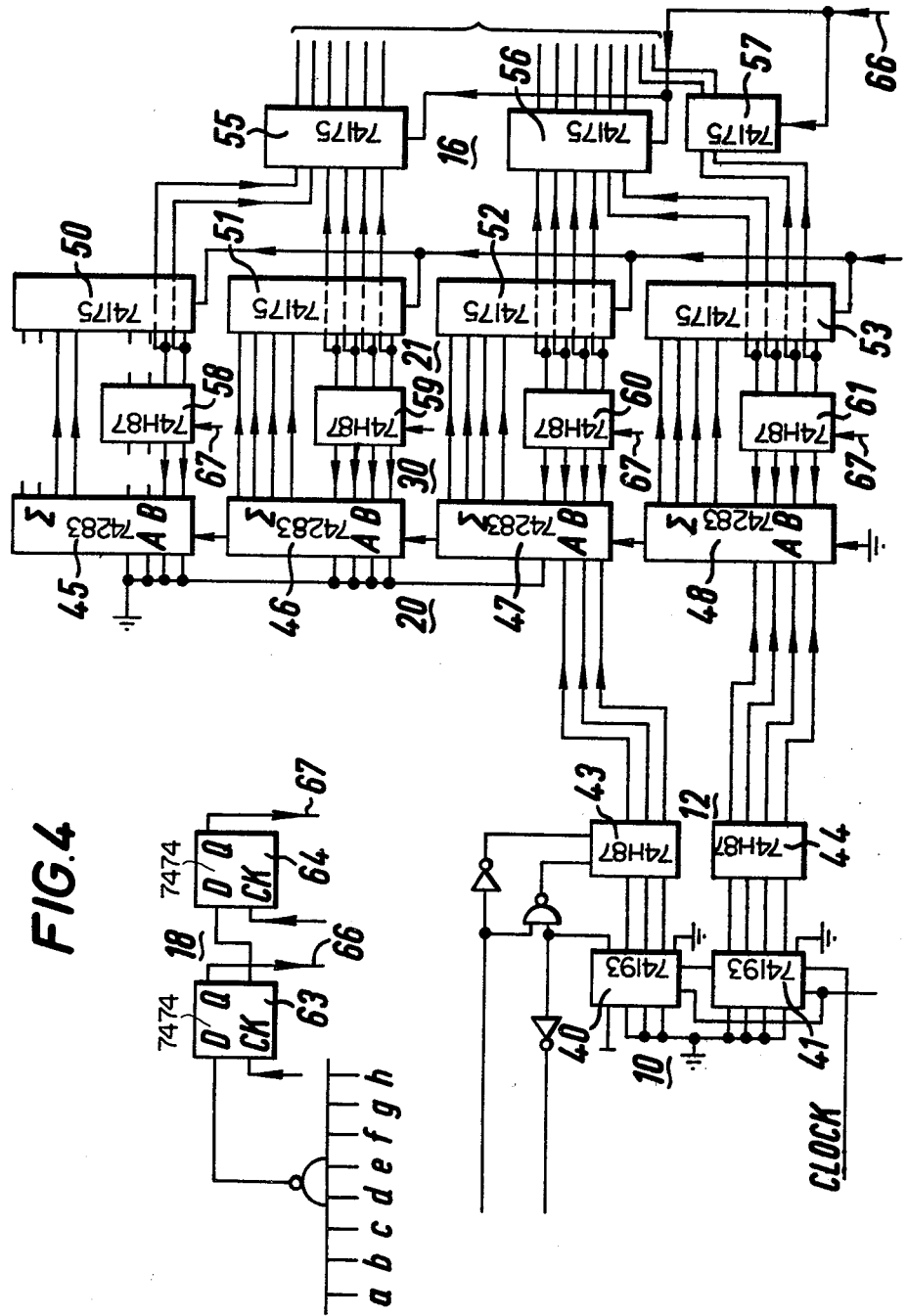
FIG. 4 is a more detailed diagram of the converter showing how it can be implemented with presently available components.

FIG. 4 illustrates the converter of FIG. 1 as modified by FIG. 3 constructed using available circuit components. The counter 10 comprises two 74193 type integrated circuits 40, 41 and the element 12 comprises two 4 bit true/complement, zero one elements 43, 44 (Type 74H87). The m-bit adder 20 comprises four 4-bit binary full adders 45–48 (Type SN 74283) and the latch 21 comprises four D-type flip flops 50–53 (Type 74175). The output latch 16 comprises three D-type flip flops 55–57 (Type 74175) and the logic means 30 comprise four 4 bit true/complement zero one elements 58–61 (Type 74H87). The timing pulse generator 18 includes two D-type flip flops 63, 64 (Type 7474) which are fed with the output bits of the counter 10 shown schematically at a to h. The pulses on line 66 form clock signals for the output latch 16, and the pulses on line 67 form clock signals for the logic means 30.

FIG. 5 shows an alternative circuit for producing accumulated numbers. The circuit comprises an n-bit up counter 80 which is arranged to count in response to clock pulses from the delta-sigma modulator, a p bit true, complement zero, one element 82 and a $2^p$ bit shift register 84 which receives the pulse density stream. In this arrangement the element 82 operates on the p bits of the counter 80 in accordance with the output of the shift register 84 and the delta sigma modulated stream. The element 82 is connected to an accumulator in a manner similar to that shown in FIG. 1 for the element 12.

Figure 6A:
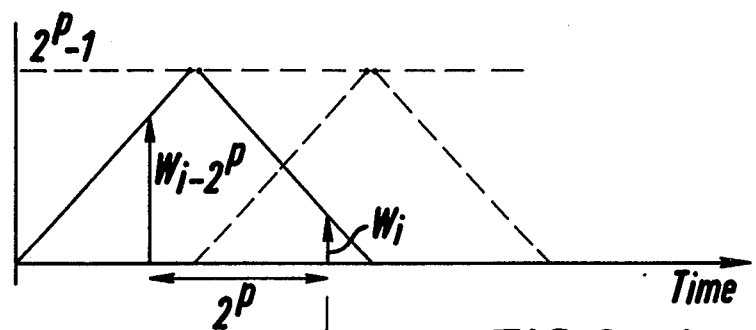
Figure 6B:
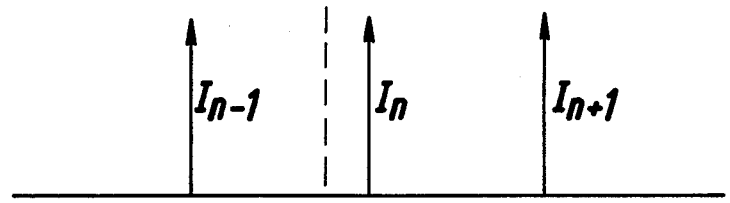

The operation of the arrangement of FIG. 5 will be described with reference to FIGS. 6(a) to 6(c). Intermediate output samples are formed by weighing the previous $2^{p+1}$ pulses from the modulator by a triangular coefficient profile (FIG. 6(b)). The $2^p$ clock periods between intermediate output samples I are used in the evaluation. The sum of the products of two input samples and their corresponding coefficients are evaluated simultaneously. If the delta sigma modulator sample just arriving is $\Delta\epsilon_i$ to be multiplied by $W_i$ and that which arrived $2^p$ clock periods before is $\Delta\epsilon_{i-2p}$ (which is the shift register output) to be multiplied by $W_{i-2p}$ then $$X_i = \Delta\epsilon_i W_i + \Delta\epsilon_{i-2p} \cdot W_{i-2p}$$

Figure 6C:
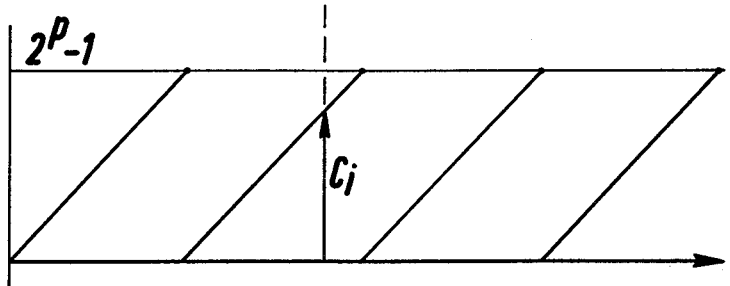

The output of the counter 80 is shown in FIG. 6(c). If the count at the $i^{th}$ period is $C_i$ then $$N_{i-2p}=C_i \qquad W_i=(2^p-1)-C_i=\overline{C_i}$$

$$X_i = \Delta\epsilon_i \overline{C_i} + \Delta\epsilon_{i-2p} C_i$$

Table 2 shows the possible value of $X_i$ which are the samples to be accumulated in the accumulator.

TABLE 2

| $\Delta\epsilon_i$ \ $\Delta\epsilon_{i-2p}$ | 0 | 1 |
|---|---|---|
| 0 | 0 | $C_i$ |
| 1 | $\overline{C_i}$ | $2^p - 1$ |

TABLE 3

| $\Delta\epsilon_i$ \ $\Delta\epsilon_{i-2p}$ | 0 | 1 |
|---|---|---|
| 0 | Zero | True |
| 1 | Comp | One |

The output of the counter 80 has to be operated on by a p bit True/Complement, zero one element driven in accordance with Table 3.

$X_i$ values are accumulated as described above to produce intermediate samples after each $2^p$ clock periods. If the accumulator is read and reset every $2^n$ clock period when the counter contains all zeros the PCM sample is the sum of the previous $2^{n-p}$ intermediate output samples.

If the clock rate of the delta sigma modulator is $f_1$ then the output sample rate is $f_2 = f_1/2^n$. The maximum output would be produced if $X_i = 2^p - 1$ over the full $2^n$ clock periods. This means that the maximum accumulated number is $2^n(2^p - 1) = 2^{n+p} - 2^n$ and the required accumulator length is $m = n + p$ bits.

Figure 7:
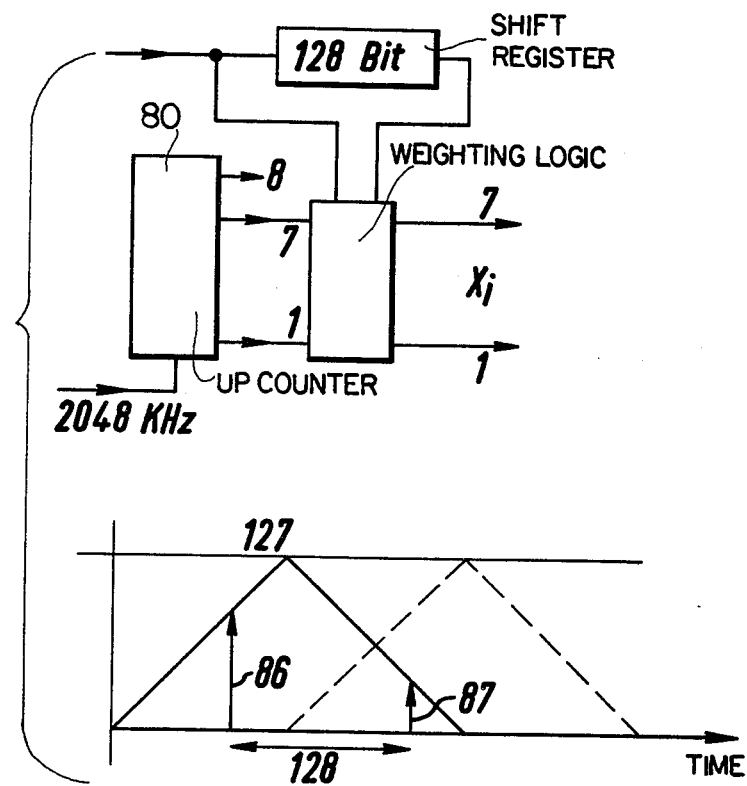

FIG. 7 illustrates the situation when the element 82 is a 7 bit true/complement zero one element, the counter 80 is an 8 bit counter, and the register 84 is a 128 bit shift register. There are two intermediate samples which are 128 samples apart. These are indicated at 86, 87.

We claim:

1. A converter for converting a supplied delta sigma modulated signal to a pulse code modulated signal comprising:
    an n bit counter connected to count supplied clock pulses and to supply n binary-valued output bits representing the number of clock pulses counted during a predetermined time interval,
    a true/complement, zero one logic element connected for logically operating on the output bits of the counter in accordance with the pulse density modulation input to produce output samples weighted in accordance with the instantaneous contents of the counter, and
    an m bit accumulator connected for accumulating said samples over a predetermined time interval to produce pulse code modulated signal samples corresponding to the supplied delta sigma modulated signal.

2. A converter as claimed in claim 1 wherein said logic element is an (n−1) bit true/complement zero one element which is connected to operate on (n−1) output bits of the counter and which is controlled to transition between the true/complement states by the most significant bit of the counter.

3. A converter as claimed in claim 2 wherein said accumulator comprises an m bit adder and an m bit latch said adder having a first input connected to receive said output samples and a second input connected to receive the latch contents, said latch being connected to then store the accumulator output in readiness for a succeeding cycle of operation.

4. A converter as claimed in any preceding claim including an output latch connected for receiving accumulated samples from the accumulator output.

5. A converter as in claim 4 further comprising means for deriving timing signals for the converter elements from the output of said counter.

6. An analog to digital converter comprising a delta sigma modulator and a converter as claimed in claim 4.

7. A converter as claimed in claim 3 including logic means connected between said second input of the m bit adder and the output of said m bit latch for controllably interrupting the flow of data therebetween.

8. A converter as claimed in claim 1 wherein said logic element comprises a $2^p$ bit shift register and a p bit, true/complement zero one element arranged to operate on p bits of the counter, said logic element having two control inputs, one for receiving the supplied delta sigma modulated signal and the other being connected to said $2^p$ bit shift register which is arranged to be fed with the supplied delta sigma modulated signal.

9. A converter as claimed in any of claims 1, 2, 3, 7 or 8 further comprising means for deriving timing signals for the converter elements from the output of said counter.

10. An analog to digital converter comprising a delta sigma modulator and a converter as claimed in any of claims 1, 2, 3, 7 or 8.

11. A converter as in claim 7 including an output latch connected for receiving accumulated samples from the accumulator output.

12. An analog to digital converter comprising a delta sigma modulator and a converter as claimed in claim 9.

13. A converter for converting a pulse density modulated sequence of binary-valued electrical signals to a pulse code modulated sequence of binary-valued electrical signals, said converter comprising:
    counter means for counting regularly occurring clock pulses and for providing binary-valued counter output signals representing the number of clock pulses counted during a predetermined time interval;
    weighting logic means connected to receive as a first input said counter output signals and as a second input said pulse density modulated sequence of signals and to provide plural binary-valued weighted output signals as a predetermined logical function of said first and second input signals; and
    accumulator means connected to receive said weighted output signals and to periodically provide as an output said pulse code modulated signals corresponding to the accumulated sum of said weighted output signals occurring over a given period of time.

14. A converter as in claim 13 wherein:
    said counter means counts in one direction and periodically cycles directly from providing its highest valued output signals to providing its lowest valued output signals, and
    said weighting logic means is controlled to convert said counter output signals to their complementary values on alternating counter cycles thereby weighting said input pulse density modulated signals in accordance with a steadily increasing/steadily decreasing repetitive cycle of values.

15. A converter as in claim 14 wherein said weighting logic means is controlled to convert to said complementary values by the highest order counter output signal.

16. A converter as in claim 14 wherein said accumulator means comprises:

adding means having first and second input ports and an output port providing summed output signals having values representing the sum of the signal values presented to said first and second input ports, said first input port being connected to receive said weighted output signals, output register means connected to receive said summed output signals, to store the values represented thereby temporarily and to thereafter provide correspondingly valued signals to said second input port, and output means connected to periodically provide said pulse code modulated signals corresponding to the value of the then existing contents of said output register means.

17. A converter as in any one of claims 13–16 further comprising timing pulse generator means connected to periodically trigger the output of said pulse code modulated signals as a function of the contents of said counter means.

18. A converter as in any one of claims 13–16 further comprising:

delay means connected to receive said pulse density modulated signals and to provide corresponding time-delayed signals, and wherein said weighting logic means is provided with a third input connected to receive said time-delayed signals to provide said weighted output signals as a predetermined logical function of said first, second and third input signals.

* * * * *